(12) United States Patent
Lee et al.

(10) Patent No.: US 11,048,357 B2
(45) Date of Patent: Jun. 29, 2021

(54) TOUCH SENSING APPARATUS AND CONTROLLER IC THEREOF

(71) Applicant: Samsung Electro-Mechanics Co., Ltd., Suwon-si (KR)

(72) Inventors: Jong Woo Lee, Suwon-si (KR); Ho Kwon Yoon, Suwon-si (KR); Joo Yul Ko, Suwon-si (KR); Byung Joo Hong, Suwon-si (KR); Je Hyuk Ryu, Suwon-si (KR); Yong Woon Ji, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/735,840

(22) Filed: Jan. 7, 2020

(65) Prior Publication Data

US 2020/0348791 A1 Nov. 5, 2020

(30) Foreign Application Priority Data

May 3, 2019 (KR) .................... 10-2019-0052183
Aug. 30, 2019 (KR) .................... 10-2019-0107689

(51) Int. Cl.
*G06F 3/041* (2006.01)
*G01R 31/317* (2006.01)
*G06F 3/044* (2006.01)

(52) U.S. Cl.
CPC ..... *G06F 3/0416* (2013.01); *G01R 31/31725* (2013.01); *G06F 3/044* (2013.01)

(58) Field of Classification Search
CPC ...... G06F 3/041; G06F 3/0412; G06F 3/0416; G06F 3/04164; G06F 3/04186; G06F 3/044; G06F 3/0443; G06F 3/0448; G06F 3/046; G01R 31/31725; G01R 31/31726
See application file for complete search history.

(56) References Cited

U.S. PATENT DOCUMENTS

| 6,639,585 | B1 * | 10/2003 | Nagai | G06F 3/046 |
| | | | | 345/173 |
| 2008/0143671 | A1 * | 6/2008 | Li | G06F 3/04166 |
| | | | | 345/156 |
| 2015/0130649 | A1 | 5/2015 | Itakura et al. | |
| 2017/0293387 | A1 * | 10/2017 | Zhang | G06F 3/044 |
| 2018/0260050 | A1 * | 9/2018 | Unseld | G06F 3/04164 |

FOREIGN PATENT DOCUMENTS

| JP | 5651036 B2 | 1/2015 |
| JP | 2015-95865 A | 5/2015 |
| KR | 10-2010-0104245 A | 9/2010 |

* cited by examiner

*Primary Examiner* — Nathan Danielsen
(74) *Attorney, Agent, or Firm* — NSIP Law (57) ABSTRACT

A controller IC of a touch sensing apparatus includes an oscillation circuit including a capacitor connected to a sensing coil, a digital converter configured to count an oscillation signal output from the oscillation circuit and to output a count value, and a contact detector configured to calculate variations in the count value during delay times, and to detect a contact strength of an object according to the variations.

17 Claims, 7 Drawing Sheets

TOUCH SENSING APPARATUS AND CONTROLLER IC THEREOF

CROSS-REFERENCE TO RELATED APPLICATION(S)

This application claims benefit under 35 USC § 119(a) of Korean Patent Application Nos. 10-2019-0052183 filed on May 3, 2019 in the Korean Intellectual Property Office, and 10-2019-0107689 filed on Aug. 30, 2019 in the Korean Intellectual Property Office, the entire disclosures of which are incorporated herein by reference for all purposes.

BACKGROUND

1. Field

The present disclosure relates to a touch sensing apparatus and a controller IC thereof.

2. Description of Related Art

A touch sensing apparatus may provide an input that can be attached to a mobile device to provide an intuitive input for a user. Recently, the touch sensing apparatus has been widely applied to various mobile devices such as, for example, smart-phones, personal digital assistants (PDA)s, and wearable devices.

However, the sensitivity of a touch sensing apparatus using a capacitive method to detect a contact object is significantly lowered in a humid environment.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a controller IC of a touch sensing apparatus, including an oscillation circuit including a capacitor connected to a sensing coil, a digital converter configured to count an oscillation signal output from the oscillation circuit and to output a count value, and a contact detector configured to calculate variations in the count value during delay times, and to detect a contact strength of an object according to the variations.

The contact detector may include a delay unit including a first delay chain configured to delay the count value by a first delay time, and to output a first delay count value, and a second delay chain configured to delay the count value by a second delay time, longer than the first delay time, and to output a second delay count value.

The contact detector may include a subtractor including a first subtractor configured to subtract the first delay count value and the count value, and to output a first difference value, and a second subtractor configured to subtract the second delay count value and the count value, and to output a second difference value.

The contact detector may include a comparator including a first comparator configured to compare the first difference value with a first comparison value, to output a first comparison signal of a high level, in response to the first difference value being equal to or greater than the first comparison value, and to output a first comparison signal of a low level, in response to the first difference value being less than the first comparison value, and a second comparator configured to compare the second difference value with a second comparison value having a higher level than the first comparison value, to output a second comparison signal of a high level, in response to the second difference value being equal to or greater than the second comparison value, and to output a second comparison signal of a low level, in response to the second difference value being less than the second comparison value.

The contact detector may include a determiner configured to determine the contact strength of the object according to whether the second comparison signal of the high level is generated, after the first comparison signal of the high level is generated.

The determiner may be configured to determine that the contact strength of the object as the first contact strength, in response to the second comparison signal of the high level being generated after a reference time elapses, after the first comparison signal of the high level is generated, and the determiner may be configured to determine the contact strength of the object as the second contact strength having a lower strength than the first contact strength, in response to the second comparison signal of the low level being generated, after the reference time elapses, after the first comparison signal of the high level is generated.

In the determiner, a change in inductance of the sensing coil by the first contact strength may be greater than a change in inductance of the sensing coil by the second contact strength.

The reference time may be determined according to a difference between a first delay time based on the first delay count value and a second delay time based on the second delay count value.

The determiner may be configured to determine the second comparison signal of the high level as noise, in response to the second comparison signal of the high level being generated before the reference time elapses and after the first comparison signal of the high level is generated.

In another general aspect, there is provided a controller IC of a touch sensing apparatus, including an oscillation circuit including a capacitor connected to a sensing coil and, a digital converter configured to count an oscillation signal output from the oscillation circuit and to output a count value, and a contact detector including a delay unit configured to delay the count value by a delay time and to output a delay count value, a subtractor configured to subtract the delay count value and the count value and to output a difference value, a comparator configured to compare the difference value and a comparison value and to generate a comparison signal, and a determiner configured to determining whether an object is in contact according to a high level or a low level of the comparison signal, wherein the determiner is further configured to compare the count value and the delay count value, in response to the comparison signal being switched from the low level to the high level, and to determine whether the contact of the object is terminated.

A comparison value compared with the difference value when the comparison signal may be in a high level state and a comparison value compared with the difference value when the comparison signal may be in a low level state differs by a hysteresis value.

The determiner may be configured to determine that the contact of the object is terminated, in response to the difference between the count value and the delay count value being less than the hysteresis value when the comparison signal is switched from the low level to the high level.

The comparison value compared with the difference value, when the comparison signal is in the high level state, may be lower than the comparison value compared with the difference value, when the comparison signal is in the low level state.

The determiner may be configured to determine that the object is in contact, in response to the comparison signal being at the high level, and that the object is not in contact, in response to the comparison signal being at the low level.

A frequency of the oscillation signal may be determined according to inductance of the sensing coil that changes according to the distance between the object and the sensing coil.

The apparatus may include a resistor connected to the sensing coil and the capacitor to perform an electrostatic discharge function.

The apparatus may include a panel unit including the oscillation circuit and a substrate on which the sensing coil is provided.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The use of the term 'may' herein with respect to an example or embodiment, e.g., as to what an example or embodiment may include or implement, means that at least one example or embodiment exists where such a feature is included or implemented while all examples and embodiments are not limited thereto.

Figure 1:
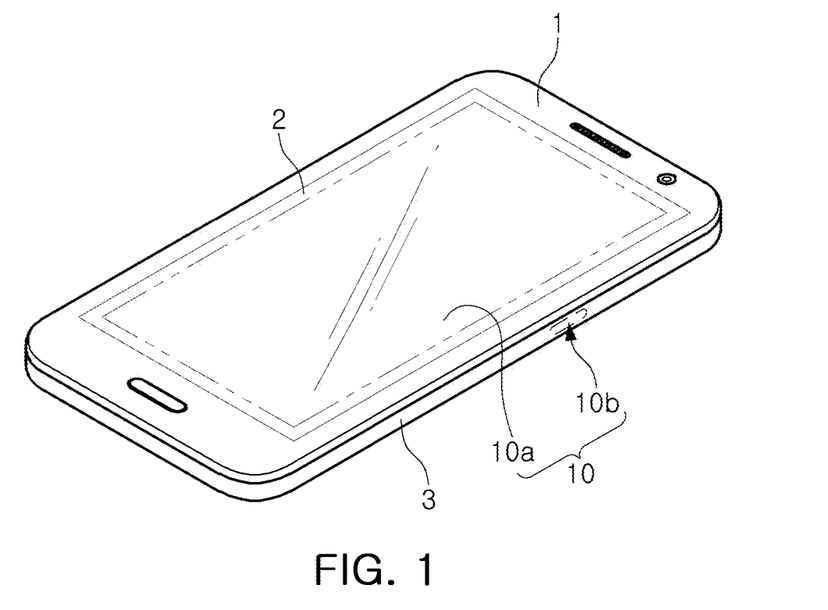
FIG. 1 is a diagram illustrating an example of an electronic apparatus employing a touch sensing apparatus.

FIG. 1 is a diagram illustrating an example of an electronic device employing a touch sensing apparatus.

Referring to FIG. 1, in an example, an electronic device 1 may include a glass 2, a case 3, and a touch sensing apparatus 10. In FIG. 1, a smartphone is illustrated as an example of the electronic device 1, but the electronic device 1 may include various types of devices such as, for example, a portable mobile device, a smartphone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a computing device, for example, a server, a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), an ultra mobile personal computer (UMPC), a portable lab-top PC, electronic product, for example, a robot, a digital camera, a digital video camera, a portable game console, an MP3 player, a portable/personal multimedia player (PMP), a handheld e-book, a global positioning system (GPS) navigation, a personal navigation device, portable navigation device (PND), a head-up display (HUD), a handheld game console, an e-book, a television (TV), a high definition television (HDTV), a smart TV, a smart appliance, a smart home device, or a security device for gate control, various Internet of Things (IoT) devices, an autonomous vehicle, an automatic or autonomous driving system, an intelligent vehicle, an advanced driver assistance system (ADAS), or any other device capable of wireless communication or network communication consistent with that disclosed herein.

The glass 2 may be formed on a front surface of the electronic device 1, and may output a screen provided from a display device provided on a rear surface of the glass 2.

The case 3 may form an appearance of the electronic device 1. For example, the case 3 may be formed in a shape accommodating the glass 2 provided on the front surface of the electronic device 1 to form an appearance of the electronic device 1 together with the glass 2. The case 3 may be formed of one of an insulator and a conductor.

The touch sensing apparatus 10 may include a first touch sensing apparatus 10a provided inside the glass 2 and a second touch sensing apparatus 10b provided inside the case 3. The first touch sensing device 10a may detect a user touch input to the glass 2, and the second touch sensing apparatus 10b may detect a user touch input to the glass 3.

Figure 2:
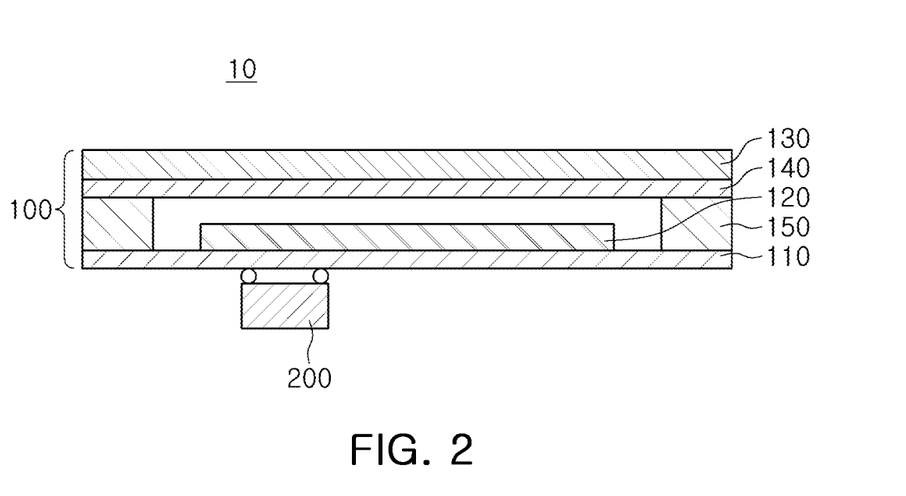
FIGS. 2, 3, and 4 are cross-sectional views illustrating examples of a touch sensing apparatus.
Figure 3:
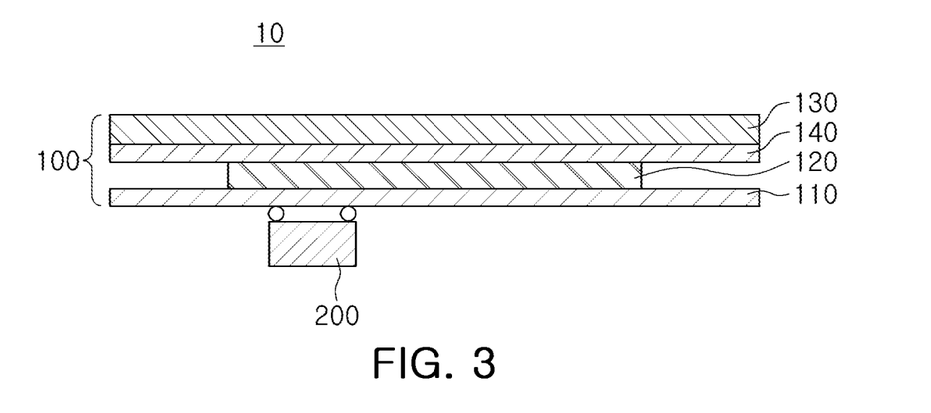
Figure 4:
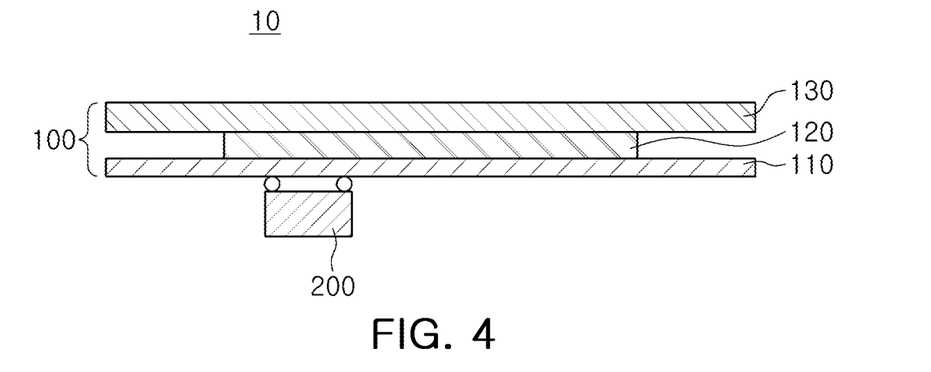
Figure 5:
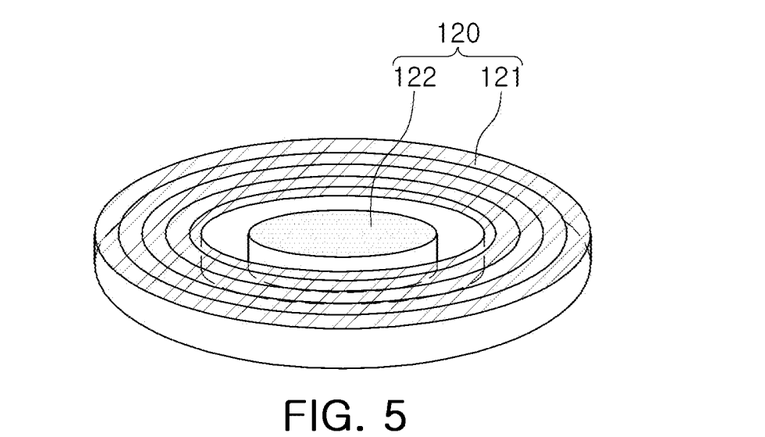
FIG. 5 is a diagram illustrating an example of a sensing coil.

FIGS. 2, 3, and 4 are diagrams illustrating examples of a touch sensing apparatus. FIG. 5 is a diagrams illustrating an example of a sensing coil.

Since the touch sensing apparatus of FIGS. 2 to 4 is similar, the touch sensing apparatus will be mainly described with reference to FIG. 2, and touch sensing apparatus of FIGS. 3 and 4 will be described based on the difference from the touch sensing apparatus of FIG. 2.

Referring to FIG. 2, the touch sensing apparatus 10 may include a panel unit 100 and a controller IC 200. The panel unit 100 may include a substrate 110, a sensing coil 120, a cover unit 130, an insertion layer 140, and a spacer 150.

The substrate 110 may include one of a printed circuit board (PCB) and a flexible printed circuit board (FPCB), and the sensing coil 120 may be provided on one surface of the substrate 110. The controller IC 200 may be provided on the other surface of the substrate 110. In an example, the controller IC 200 may be provided on the substrate 110 on which the sensing coil 120 is not provided.

The sensing coil 120 may be provided in a central region of the substrate 110. In an example, the sensing coil 120 may be formed by a circuit pattern formed on the substrate 110. In another example, the sensing coil 120 may be formed of one of a wound inductor coil and a solenoid coil, and may be mounted on the substrate 110.

In an example, the sensing coil 120 may be formed of one of a wound inductor coil and a solenoid coil, and may be mounted on the substrate 110.

The coil unit 121 of the sensing coil 120 may be formed in a circular circuit pattern. In other examples, the coil unit 121 of the sensing coil 120 may be formed in various circuit pattern shapes such as triangular and a quadrangular patterns.

In an example, the central region of the coil unit 121 is hollow. In an example, a circuit pattern for forming the coil unit 121 is not provided in the hollow portion. The core unit 122 may be provided in the hollow portion. The core unit 122 may be insulated from the coil unit 121 and may be formed of one of a magnetic material and a conductor. The core unit 122 concentrates a magnetic field of the coil unit 121, so that sensing sensitivity of the touch sensing apparatus 10 is improved.

Referring to FIG. 2 again, the cover unit 130 is provided on a top layer of the touch sensing apparatus 10. A contact object, such as a user finger, comes in contact with the cover unit 130, and the cover unit 130 may have the same configuration as one of the glass 2 and the case 3 of FIG. 1.

In an example, the insertion layer 140 is provided below the cover unit 130. The insertion layer 140 is disposed to face the substrate 110 and the sensing coil 120 with the spacer 150 formed between edges of the substrate 110 interposed therebetween.

The spacer 150 may be formed in an edge region of the substrate 110, and one surface thereof may be bonded to the substrate 110 and the other surface thereof may be bonded to the insertion layer 140. The spacer 150 may be formed to be thicker than the thickness of the sensing coil 120 to provide a space between the sensing coil 120 and the cover unit 130.

In FIG. 2, although the touch sensing apparatus 10 is illustrated as including the spacer 150, in order to thin the touch sensing apparatus 10, as shown in FIG. 3, the spacer 150 may be omitted, and the insertion layer 140 may be disposed to be bonded to the sensing coil 120.

The cover unit 130 may be formed of one of an insulator and a conductor. For example, when the cover unit 130 corresponds to the glass 2 of FIG. 1, the cover unit 130 may be formed of an insulator, and when the cover unit 130 corresponds to the case 3 of FIG. 1, the cover unit 130 may be formed one of an insulator and a conductor.

The insertion layer 140 may be formed of one of a conductor, a magnetic body, and an insulator.

When the insertion layer 140 is formed of a conductor and a magnetic body, a magnetic field of the sensing coil 120 may be concentrated by the insertion layer 140 formed of the conductor and the magnetic body, thereby improving sensing sensitivity. In an example, the conductor may be formed of a phosphor bronze alloy and Inconel 718 having an excellent elastic restoring force.

When the insertion layer 140 is formed of an insulator, the insertion layer 140 may be formed of an elastic insulator. The insertion layer 140 may be formed of an elastic insulator, and may provide an elastic touch when the contact object contacts the cover unit 130. In an example, the elastic insulator may include metal particles. For example, the elastic insulator including the metal particles may be manufactured by mixing a resin and metal powder. The magnetic field may be concentrated by the elastic insulator including the metal particles, thereby improving sensing sensitivity.

In an example, the insertion layer 140 may be formed of a material different from that of the cover unit 130. For example, when the cover unit 130 is formed of an insulator, the insertion layer 140 may be formed of a conductor, and when the cover unit 130 is formed of a conductor, the insertion layer 140 may be formed of an insulator.

In FIGS. 2 and 3, although the touch sensing apparatus 10 includes the insertion layer 140, when the cover unit 130 is formed of a conductor, a magnetic field may be concentrated by the cover unit 130 formed of a conductor, thereby improving sensing sensitivity. Therefore, as shown in FIG. 4, the insertion layer 140 may be omitted.

In an example, a ferrite sheet may be provided on the other surface of the substrate 110. The ferrite sheet may block noise and an eddy current flowing from the other surface of the substrate 110 and may concentrate the magnetic field of the sensing coil 120. When the ferrite sheet is provided on the other surface of the substrate 110, a controller IC 200 may be provided on the substrate 110 with the ferrite sheet interposed therebetween.

The ferrite sheet may be formed of a soft magnetic material, and the soft magnetic material may be manufactured by mixing the ferrite powder and a resin layer. The soft magnetic material manufactured by mixing the ferrite powder and the resin layer may be soft and easily deformed. Therefore, the soft magnetic material may improve brittleness and cracking characteristics of ferrite.

In an example, the core unit 122 of the sensing coil 120 may be electrically connected to at least one of the ferrite sheet and the insertion layer 140 provided on the other surface of the substrate 110. Thus, the magnetic field of the coil unit 121 of the sensing coil 120 may be further concentrated.

When a contact object such as a user finger comes in contact with the cover unit 130, the contact object is a secondary coil of a transformer, and the sensing coil 120 operates like a primary coil of the transformer.

When an eddy current is generated in the contact object (secondary coil), a magnetic field is generated, and inductance of the sensing coil (primary coil) changes according to the generated magnetic field. The magnetic field generated by the contact object (secondary coil) offsets the magnetic field generated by the sensing coil (primary coil), and as the contact object approaches, the inductance of the sensing coil (primary coil) decreases.

Even when the contact object is not in contact with the cover unit 130, the inductance of the sensing coil 120 may be changed according to a distance between the sensing coil 120 and the contact object.

Therefore, the touch sensing apparatus 10 may be used to detect a hovering touch in which the contact object does not directly contact the cover unit 130, and may detect user input, even in a state in which the cover unit 130 is not bent or deformed. Hovering indicates a state in which the contact object is spaced apart from the cover unit 130 by a distance.

The touch sensing apparatus of an inductive method accurately detects the contact object, even if an user wears a glove, even if the touch sensing apparatus is located in a humid environment, unlike the touch sensing apparatus of a capacitive method.

Figure 6:
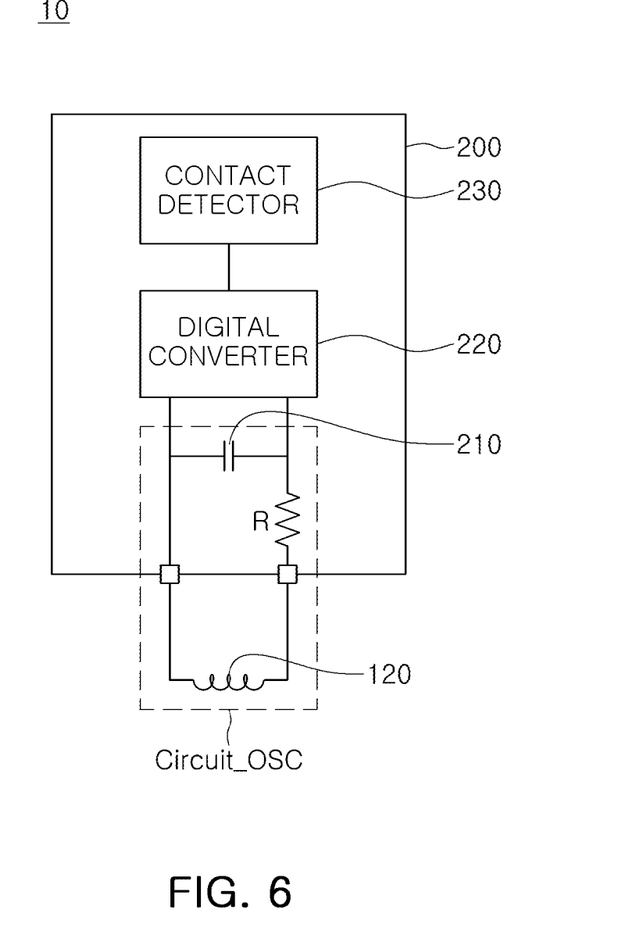
FIG. 6 is a diagram illustrating an example of a touch sensing apparatus.

FIG. 6 is a diagram illustrating an example of a touch sensing apparatus.

Referring to FIG. 6, the touch sensing apparatus 10 may include a sensing coil 120 and a controller IC 200. The controller IC 200 may include a capacitor 210, a digital converter 220, and a contact detector 230. In an example, the capacitor 210, the resistor R, the digital converter 220, and the contact detector 230 may be implemented by one integrated circuit.

The sensing coil 120 corresponds to the same configuration as the sensing coil 120 of FIGS. 2, 3, and 4. The capacitor 210 may be connected to the sensing coil 120 to form an oscillation circuit (Circuit_OSC) to generate an oscillation signal. The frequency of the oscillation signal may be determined according to the inductance of the sensing coil 120 that changes according to the distance between the contact object and the sensing coil 120.

The controller IC 200 may further include a resistor R. The resistor R may be electrically connected to the sensing coil 120 and the capacitor 210 to perform an electrostatic discharge (ESD) function. In an example, the controller IC 200 may be configured in a form in which the resistor R is removed.

In the oscillation circuit (Circuit_OSC) constituted by the sensing coil 120 and the capacitor 210, an oscillation signal is output, and an oscillation frequency of the oscillation signal is converted into a digital value by the digital converter 220. The contact detector 230 may detect a contact object from the digital value output from the digital converter 220.

Figure 7:
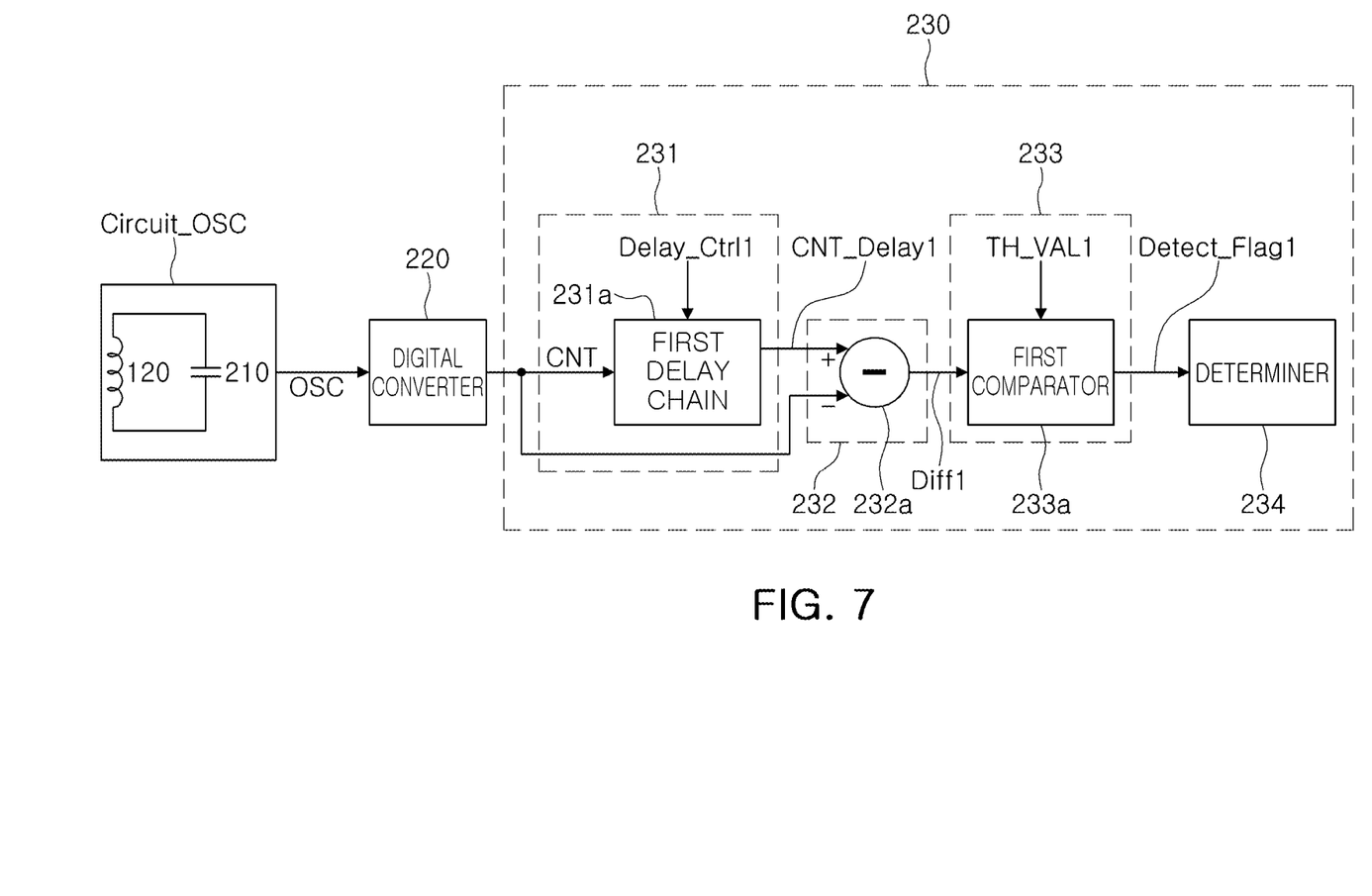
FIG. 7 is a diagram illustrating an example of a touch sensing apparatus.

FIG. 7 is a diagram illustrating an example of a touch sensing apparatus.

Referring to FIG. 7, an oscillation circuit (Circuit_osc) formed by the sensing coil 120 and the capacitor 210 outputs an oscillation signal OSC.

The digital converter 200 counts an oscillation signal OSC and generates a count value CNT. The digital converter 220 may count the oscillation signal OSC using a reference clock for a reference time. According to an embodiment, the digital converter 220 may divide the oscillation signal OSC, generate a divided signal, and count the generated divided signal by using a reference clock for a reference time.

The contact detector 230 may include a delay unit 231, a subtractor 232, a comparator 233, and a determiner 234.

The delay unit 231 may include at least one delay chain. For example, the delay unit 231 may include a first delay chain 231a. The first delay chain 231a delays the count value CNT by a first delay time according to a first delay control signal Delay_Ctrl1, and outputs a first delay count value CNT_Delay1. The first delay time of the count value CNT may be determined according to the first delay control signal Delay_Ctrl1.

The subtractor 232 may include at least one subtractor. For example, the subtractor 232 may include a first subtractor 232a. The first subtractor 232a subtracts the first delay count value CNT_Delay1 and the count value CNT, and outputs a first difference value Diff1. The count value CNT corresponds to a currently counted value, and the first delay count value CNT_Delay1 corresponds to a value counted before the first delay time from the present.

The comparator 233 may include at least one comparator. For example, the comparator 233 may include a first comparator 233a. The first comparator 233a compares the first difference value Diff1 and a first comparison value TH_VAL1, and when the first difference value Diff1 is equal to or greater than the first comparison value TH_VAL1, a first comparison signal Detect_Flag1 of a high level is output. When the first difference value Diff1 is less than the first comparison value TH_VAL1, a first comparison signal of a low level Detect_Flag1 is output.

In an example, when the first comparison signal Detect_Flag1 is in a low level state, the first comparison value TH_VAL1 compared with the first difference value Diff1 may have a different value from the first comparison value TH_VAL1 compared with the first difference value Diff1, when the first comparison signal Detect_Flag1 is in a high level state. In an example, when the first comparison signal Detect_Flag1 is in a low level state, the first comparison value TH_VAL1 compared with the first difference value Diff1 may differ by a hysteresis value with the first comparison value TH_VAL1 compared with the first difference value Diff1, when the first comparison signal Detect_Flag1 is in a high level state.

When the first comparison signal Detect_Flag1 is in a low level state, the first comparison value TH_VAL1 compared with the first difference value Diff1 may be greater than the first comparison value TH_VAL1 compared with the first difference value Diff1, when the first comparison signal Detect_Flag1 is in a high level state.

For example, when the first comparison signal Detect_Flag1 is in a low level, the first comparison value TH_VAL1 compared with the first difference value Diff1 may correspond to ⅛ of a maximum value of the first difference value Diff1. When the first comparison signal Detect_Flag1 is in a high level, the first comparison value TH_VAL1 compared with the first difference value Diff1 may correspond to 1/16 of the maximum value of the first difference value Diff1. Therefore, the first comparator 233a may have hysteresis characteristics.

Figure 8:
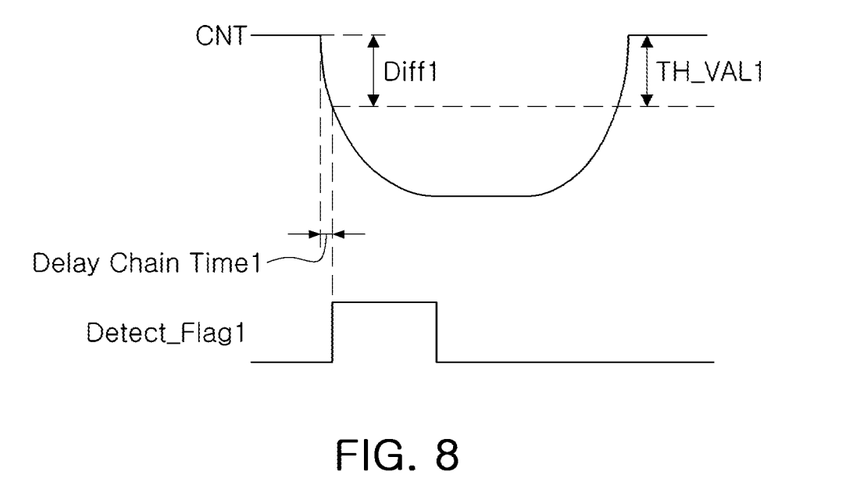
FIG. 8 is a diagram illustrating an example of a signal output from a main part of a touch detector according to the embodiment of FIG. 7.

FIG. 8 illustrates an example of a signal output from a main part of the touch detector according to the embodiment of FIG. 7.

Referring to FIG. 8, when a contact object contacts a panel unit, as the inductance of the sensing coil increases, the frequency of the oscillation signal OSC decreases and the count value CNT decreases.

When the first difference value Diff1 corresponding to a difference value between the first delay count value CNT_Delay1 and the count value CNT is equal to or greater than the first comparison value TH_VAL1, the first comparison signal Detect_Flag1 having a high level is output. When the first difference value Diff1 is less than the first comparison value TH_VAL1, the first comparison signal Detect_Flag1 having a low level is output.

When the first comparison signal Detect_Flag1 having a high level is provided from the comparator 233, the determiner 234 determines that the contact object contacts the panel unit, and when the first comparison signal Detect_Flag1 of a low level is provided from the comparator 233, the determiner 234 determines that the contact object does not contact the panel unit.

In an example, when the first comparison signal Detect_Flag1 is switched from the low level to the high level, the determiner 234 saves a count value CNT_Delay when the first comparison signal Detect_Flag1 is switched from the low level to the high level. The determiner 234 compares the saved delay count value CNT_Delay with the current count value CNT, and when the difference between the saved delay count value CNT_Delay and the count value CNT is less than the hysteresis value, the determiner 234 may determine that a touch operation is terminated because the contact object in contact with a touch panel is separated from the touch panel.

In an example, the touch detector 230 determinates that the contact object contacts the panel unit when the change in the count value CNT during the first delay chain time 1 is greater than or equal to the first comparison value TH_VAL1. Therefore, it is determined that that a slow change of the count value CNT for a time longer than the first delay chain time 1 is caused by the change of external environmental factors or the change by noise, thereby precisely detecting whether the contact object is in contact.

Figure 9:
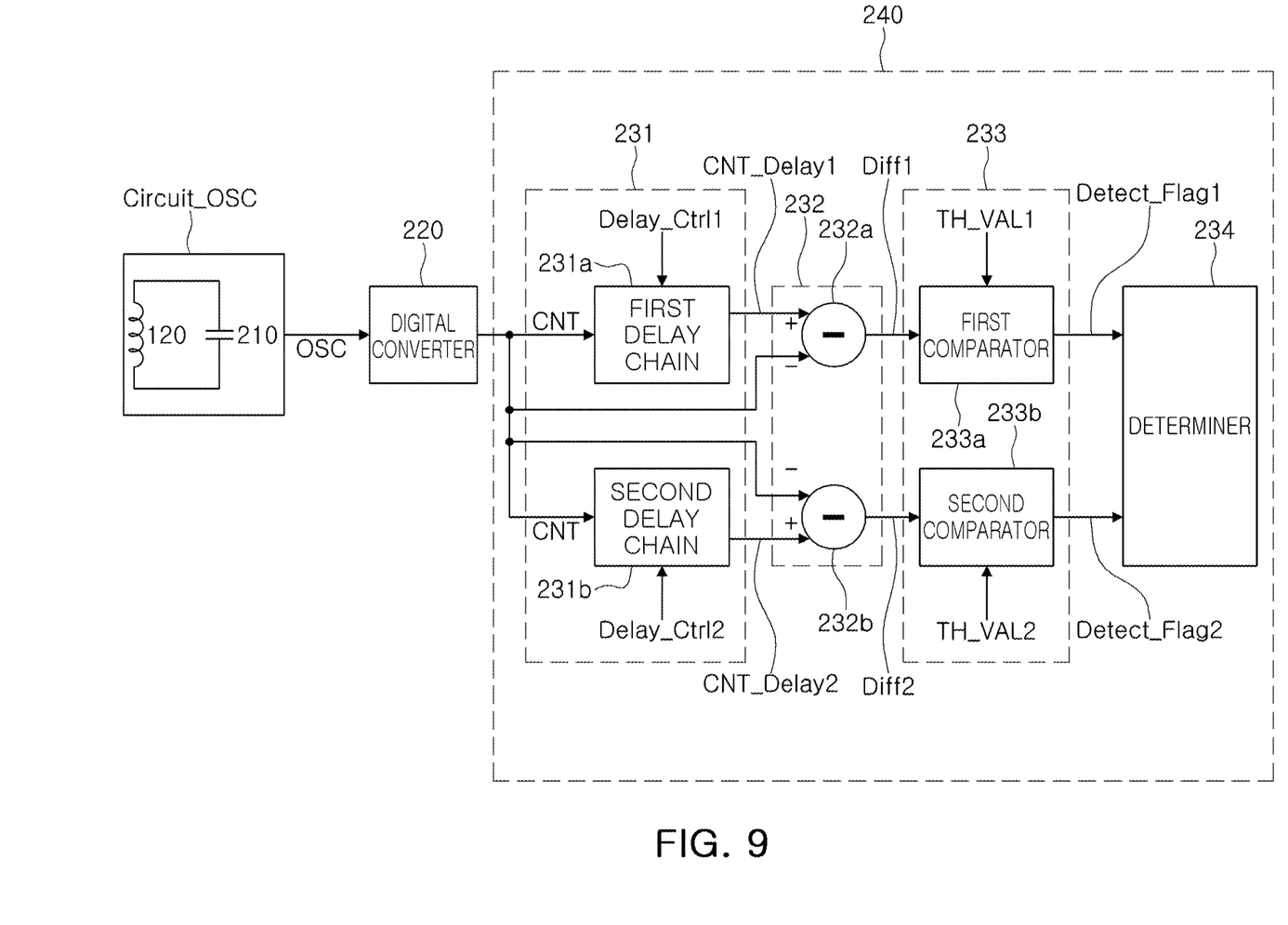
FIG. 9 is a diagram illustrating an example of a touch detector.

FIG. 9 is a diagram illustrating an example of a contact detector.

In an example, the contactor detector may calculate variations in count values during different delay times, and may detect intensity of inputs provided to the panel unit, according to the calculated variations. Hereinafter, an operation of the contact detector according to an example will be described with reference to FIG. 9. Meanwhile, since the contact detector of FIG. 9 is similar to the contact detector according to the embodiment of FIG. 7, redundant description may be omitted.

A delay unit 231 may include at least one delay chain. For example, the delay unit 231 may include a first delay chain 231a and a second delay chain 231b. The first delay chain 231a delays the count value CNT by the first delay time according to the first delay control signal Delay_Ctrl1, and outputs the first delay count value CNT_Delay1. According to the first delay control signal Delay_Ctrl1, a first delay time of the count value CNT may be determined.

The second delay chain 232a delays the count value CNT by the second delay time according to the second delay control signal Delay_Ctrl2, and outputs the second delay count value CNT_Delay2. The second delay time of the count value CNT may be determined according to the second delay control signal Delay_Ctrl 2.

The subtractor 232 may include at least one subtractor. For example, the subtractor 232 may include a first subtractor 232a and a second subtractor 232b.

The first subtractor 232a subtracts the first delay count value CNT_Delay1 and the count value CNT, and outputs a first difference value Diff1. The count value CNT corresponds to the currently counted value, and the first delay count value CNT_Delay1 corresponds to a value counted before the first delay time from the present time.

The second subtractor 232b subtracts the second delay count value CNT_Delay2 and the count value CNT, and outputs a second difference value Diff2. The count value CNT corresponds to the currently counted value, and the second delay count value CNT_Delay2 corresponds to a value counted before the second delay time from the present time.

The comparator 233 may include at least one comparator. For example, the comparator 233 may include a first comparator 233a and a second comparator 233b.

The first comparator 233a compares the first difference value Diff1 and the first comparison value TH_VAL1, and when the first difference value Diff1 is equal to or greater than the first comparison value TH_VAL1, the first comparator 233a outputs a first comparison signal Detect_Flag1 of a high level. When the first difference value Diff1 is less than the first comparison value TH_VAL1, the first comparator 233a outputs a first comparison signal Detect_Flag1 of a low level.

The second comparator 233b compares the second difference value Diff2 and the second comparison value TH_VAL2, and when the second difference value Diff2 is equal to or greater than the second comparison value TH_VAL2, the second comparator 233b outputs a second comparison signal Detect_Flag2 of a high level. When the second difference value Diff2 is less than the second comparison value TH_VAL2, the second comparator 233b outputs a second comparison signal Detect_Flag2 of a low level.

While the touch detector of FIG. 7 only detects a presence or absence of a touch, the touch detector of FIG. 9 may determine strength of the contact through the first comparison signal and the second comparison signal.

Figure 10:
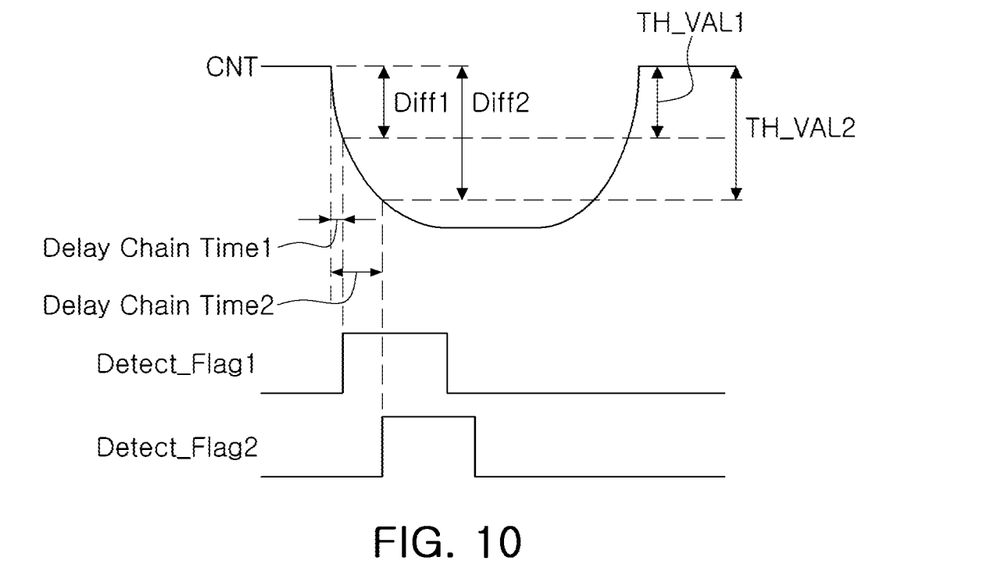
FIGS. 10 and 11 are diagrams illustrating examples of signals output from a main part of the touch detector according to an embodiment of FIG. 9.
Figure 11:
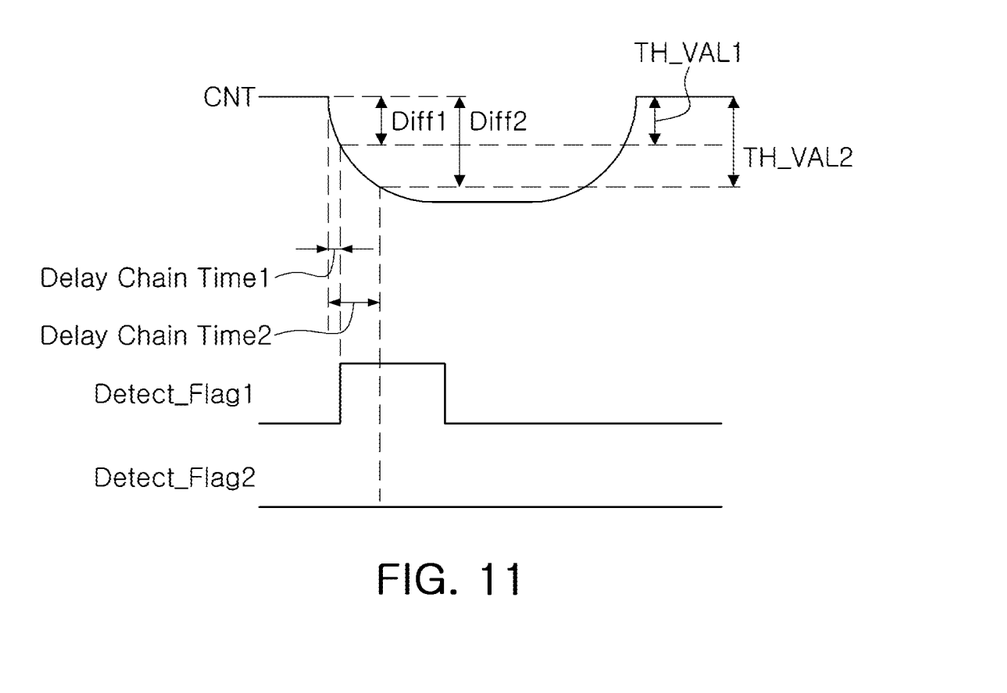

FIGS. 10 and 11 illustrate signals output from a main part of the touch detector according to the example of FIG. 9.

FIG. 10 illustrates a signal output from the main part of the touch detector when the contact object contacts the panel unit with the first contact strength, and FIG. 11 illustrates a signal output from the main part of the touch detector when the contact object contacts the panel unit with the second touch When the contact object is in contact with the panel unit with the first contact strength, a change in inductance of the sensing coil may be greater than a change in inductance of the sensing coil when the contact object is in contact with the panel unit with the second contact strength. That is, intensity of the first contact strength may be greater than that of the second contact strength. The first contact strength corresponds to a case in which the contact object is in firm contact with the panel unit, and the second contact strength corresponds to a case in which the contact object is in weak contact with the panel unit.

As described herein, contact includes not only a case in which the contact object directly contacts the panel unit, but also when the contact object is spaced apart from the panel unit by a distance, but the contact object is detected.

Therefore, the first contact strength and the second contact strength of the contact object may be distinguished by the distance between the contact object and the panel unit and a force applied to the panel unit by the contact object, or the like.

For example, a case in which the distance between the contact object and the panel unit is close can be understood as a case in which the contact object contacts the panel unit by the first contact strength, and a case in which the distance between the contact object and the panel unit is far can be understood as a case in which the contact object contacts the panel unit by the second contact strength.

In addition, a case in which the force applied to the panel unit by the contact object is strong can be understood as a case in which the contact object contacts the panel unit by the first contact strength. A case in which the force applied to the panel unit by the contact object is weak can be understood as a case in which the contact object contacts the panel unit by the second contact strength.

Referring to FIGS. 10 and 11, when the contact object contacts the panel unit, an inductance of the sensing coil increases, a frequency of the oscillation signal OSC decreases and a count value CNT decreases. Comparing FIGS. 10 an 11, when the contact object is in contact with the panel unit with the first contact strength, when a change in a count value (CNT) may be large, while when the contact object is in contact with the panel unit with the second contact strength, a change in a count value (CNT) may be small.

In FIGS. 10 and 11, it is assumed that a first comparison value TH_VAL1 has a lower level than a second comparison value TH_VAL2, and a first delay chain time 1 according to a first delay control signal Delay_Ctrl1 has a shorter time period than a second delay chain time 2 according to a second delay control signal Delay_Ctrl2.

Referring to FIGS. 10 and 11, a first difference value Diff1 is greater than or equal to the first comparison value TH_VAL1, the first comparison signal Detect_Flag1 having a high level is output. Subsequently, according to a result of the comparison between a second difference value Diff2 and the second comparison value TH_VAL2, the second comparison signal Detect_Flag2 having a high level or a low level is output.

Referring to FIG. 10, when the contact object contacts the panel unit with the first contact strength, since the second difference value Diff2 is greater than or equal to the second comparison value TH_VAL2, the second comparison signal Detect_Flag2 having a high level is output. Referring to FIG. 11, when the contact object contacts the panel unit with the second contact strength, since the second difference value Diff2 is less than the second comparison value TH_VAL2, the second comparison signal Detect_Flag2 of a low level is output.

Therefore, after the first comparison signal Detect_Flag1 having a high level is generated, the determiner 234 may determine the contact strength of the contact object according to whether the second comparison signal Detect_Flag2 having a high level is generated after a reference time elapses.

Therefore, after the first comparison signal Detect_Flag1 having a high level is generated, the second comparison signal Detect_Flag2 having a high level is generated after the reference time elapses, the determiner 234 may determine the contact strength of the contact object by the first contact strength.

In an example, after the first comparison signal Detect_Flag1 having the high level is generated, the determiner 234 may determine the contact strength of the contact object by the second strength when the second comparison signal Detect_Flag2 of the low level is output, after the reference time elapses. The reference time may be determined by time difference between the first delay chain time 1 and the second delay chain time 2.

In an example, when the second comparison signal Detect_Flag2 having a high level is generated after the first comparison signal Detect_Flag1 of high level is generated, before the reference time elapses, the determiner 234 may determine that the second comparison signal Detect_Flag2 is changed by external environmental factors, and the second comparison signal Detect_Flag2 having a high level may be determined as noise. Accordingly, the determiner 234 may accurately detect a variation in the second comparison signal Detect_Flag2 according to external environmental factors, and accurately detect the contact strength.

Meanwhile, as described above, although contact strength of the contact object is described as being divided into two contact strengths, to determine various contact strengths, the present disclosure may be modified in various forms without departing from the spirit and scope of the illustrative examples described. For example, a delay unit 231 of FIG. 9 may include N delay chains, the subtractor 232 may include N subtractors, and the comparator 233 may include N comparators, such that the determiner 234 may be determined by dividing the contact strength of the contact object into N pieces.

As set forth above, provided are touch sensing apparatus for detecting a contact object using an inductive method and a controller IC thereof. As set forth above, it is possible to accurately determine a contact object by using an inductive method described herein.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A controller IC of a touch sensing apparatus, comprising:
   an oscillation circuit comprising a capacitor connected to a sensing coil;
   a digital converter configured to count an oscillation signal output from the oscillation circuit and to output a count value; and a contact detector configured to calculate variations in the count value with differently delayed delay times, and to detect a contact strength of an object according to the variations.

2. The apparatus of claim 1, wherein the contact detector comprises a delay unit comprising:
a first delay chain configured to delay the count value by a first delay time, among the differently delayed delay times, and to output a first delay count value, and
a second delay chain configured to delay the count value by a second delay time, among the differently delayed delay times, longer than the first delay time, and to output a second delay count value.

3. The apparatus of claim 2, wherein the contact detector further comprises a subtractor comprising:
a first subtractor configured to subtract the first delay count value and the count value, and to output a first difference value, and
a second subtractor configured to subtract the second delay count value and the count value, and to output a second difference value.

4. The apparatus of claim 3, wherein the contact detector further comprises a comparator comprising:
a first comparator configured to compare the first difference value with a first comparison value, to output a first comparison signal of a high level, in response to the first difference value being equal to or greater than the first comparison value, and to output a first comparison signal of a low level, in response to the first difference value being less than the first comparison value, and
a second comparator configured to compare the second difference value with a second comparison value having a higher level than the first comparison value, to output a second comparison signal of a high level, in response to the second difference value being equal to or greater than the second comparison value, and, and to output a second comparison signal of a low level, in response to the second difference value being less than the second comparison value.

5. The apparatus of claim 4, wherein the contact detector further comprises a determiner configured to determine the contact strength of the object according to whether the second comparison signal of the high level is generated, after the first comparison signal of the high level is generated.

6. The apparatus of claim 5, wherein the determiner is further configured to determine that the contact strength of the object as the first contact strength, in response to the second comparison signal of the high level being generated after a reference time elapses, after the first comparison signal of the high level is generated, and
the determiner is further configured to determine the contact strength of the object as the second contact strength having a lower strength than the first contact strength, in response to the second comparison signal of the low level being generated, after the reference time elapses, after the first comparison signal of the high level is generated.

7. The apparatus of claim 6, wherein the reference time is determined according to a difference between a first delay time, among the differently delayed delay times, based on the first delay count value and a second delay time, among the differently delayed delay times, based on the second delay count value.

8. The apparatus of claim 7, wherein the determiner is further configured to determine the second comparison signal of the high level as noise, in response to the second comparison signal of the high level being generated before the reference time elapses and after the first comparison signal of the high level is generated.

9. The apparatus of claim 5, wherein in the determiner, a change in inductance of the sensing coil by the first contact strength is greater than a change in inductance of the sensing coil by the second contact strength.

10. A controller IC of a touch sensing apparatus, comprising:
an oscillation circuit comprising a capacitor connected to a sensing coil and;
a digital converter configured to count an oscillation signal output from the oscillation circuit and to output a count value; and
a contact detector comprising:
a delay unit configured to delay the count value by a delay time and to output a delay count value,
a subtractor configured to subtract the delay count value and the count value and to output a difference value,
a comparator configured to compare the difference value and a comparison value and to generate a comparison signal, and
a determiner configured to determining whether an object is in contact according to a high level or a low level of the comparison signal,
wherein the determiner is further configured to compare the count value and the delay count value, when the comparison signal is switched from the low level to the high level, and to determine whether the contact of the object is terminated.

11. The apparatus of claim 10, wherein the comparison value compared with the difference value when, the comparison signal is at the high level and the comparison value compared with the difference value, when the comparison signal is at the low level, differ by a hysteresis value.

12. The apparatus of claim 11, wherein the determiner is further configured to determine that the contact of the object is terminated, in response to the difference between the count value and the delay count value being less than the hysteresis value when the comparison signal is switched from the low level to the high level.

13. The apparatus of claim 11, wherein the comparison value compared with the difference value, when the comparison signal is at the high level, is lower than the comparison value compared with the difference value, when the comparison signal is at the low level.

14. The apparatus of claim 10, wherein the determiner is further configured to determine that the object is in contact, in response to the comparison signal being at the high level, and that the object is not in contact, in response to the comparison signal being at the low level.

15. The apparatus of claim 10, wherein a frequency of the oscillation signal is determined according to inductance of the sensing coil that changes according to the distance between the object and the sensing coil.

16. The apparatus of claim 10, further comprising a resistor connected to the sensing coil and the capacitor to perform an electrostatic discharge function.

17. The apparatus of claim 10, further comprising a panel unit including the oscillation circuit and a substrate on which the sensing coil is provided.

* * * * *